United States Patent [19]

Roy et al.

[11] Patent Number: 4,871,972
[45] Date of Patent: Oct. 3, 1989

[54] APPARATUS FOR DETECTING FAULTY POWER LINE INSULATOR

[76] Inventors: Jacques T. Roy, 844, 10th St, St-Antoine, Quebec, Canada, J7Z 3K5; Germain R. Magnan, 3416, Metcalfe, Rawdon, Quebec, Canada, J0K 1S0

[21] Appl. No.: 216,130

[22] Filed: Jul. 7, 1988

[30] Foreign Application Priority Data

Jul. 13, 1987 [GB] United Kingdom ................. 8716419

[51] Int. Cl.⁴ ........................................... G01R 31/12
[52] U.S. Cl. ................................... 324/551; 324/552
[58] Field of Search .................. 324/98, 101, 114, 149, 324/551, 552, 541, 509, 140 R, 126

[56] References Cited

U.S. PATENT DOCUMENTS

| | | | |
|---|---|---|---|
| 1,607,425 | 11/1926 | Austin | 324/552 |
| 1,923,565 | 8/1933 | Austin | 324/552 |
| 2,281,470 | 4/1942 | Wright | 324/62 R |
| 3,363,172 | 1/1968 | Doble | 324/552 |
| 4,266,184 | 5/1981 | Devine | 324/552 |
| 4,357,573 | 11/1982 | Heuzé | 324/559 |
| 4,760,343 | 7/1988 | Vaillancourt et al. | 324/552 |

*Primary Examiner*—Reinhard J. Eisenzopf
*Assistant Examiner*—Maura K. Regan
*Attorney, Agent, or Firm*—Roland L. Morneau

[57] ABSTRACT

An apparatus for detecting faulty power line insulators of the suspension type on an energized power line by comparing two adjacently mounted insulators in series. The apparatus is generally made like a three-prong fork. Each prong has a metal tip forming a probe adapted to conductingly straddle two adjacently mounted insulators. The lateral prongs are each connected to the central prong through a high voltage resistor and an ammeter. Comparison of the amperages registered by both ammeters indicates the existence of a faulty insulator.

10 Claims, 3 Drawing Sheets

APPARATUS FOR DETECTING FAULTY POWER LINE INSULATOR

BACKGROUND OF THE INVENTION

1. Field of the Invention

The invention is related to an apparatus for testing insulators and more particularly to an apparatus for detecting faulty insulators of the "suspension" type used on overhead power lines.

In the overhead transmission of electrical power, lines are supported from poles or towers by means of insulators made of dielectric material.

From these insulators, the ones commonly referred to as "end-of-line" type or "suspension" type are responsable for a high percentage of the power failures.

The combined effects of changes in temperature and humidity to which the insulators are constantly submitted, tend, over a period of time, to cause their deterioration. This deterioration being a function of both the micro-structure of each individual insulator and it's reaction to a changing environment, it is highly improbable that insulators at a specific location which are usually connected in strings of two or more all become defective at the same time.

In most cases, where two insulators are used, if one becomes defective, the remaining one can usually withstand the phase to ground voltage for a limited period of time if extreme conditions such as overvoltages, extreme contamination, etc, do not prevail.

An object of this invention is to provide means to detect faulty insulator so that it can be replaced before an other insulator of the same string becomes defective therefore creating a costly power failure.

Another object of this inventionis to provide means to detect faulty insulators on energized lines in such a manner that it becomes both time saving and safe for the operator.

2. Prior Art

Many methods and apparatus have been developed in the past to detect faulty insulators. One such method and apparatus is disclosed in U.S. Pat. No. 1,923,565. According to this patent, a forked probe is positioned across an insulator. A direct voltage, generated by a D.C. (direct current) generator (called a Megger), is applied to the insulator and the flow of current across a faulty insulator is detected and shown on a current indicator. The method and apparatus according to this patent have several disadvantages. The transmission line must be de-energized during the testing to avoid placing a high voltage on the test equipment and to ensure the safety of the personnel that carries out the testing. A separate source of power such as, for example, a battery must be used, in addition to using a Megger, to energize the primary induction coil of the transformer which forms part of the apparatus.

According to U.S. Pat. No. 1,943,391, insulation may be tested by impressing a potential sufficient to cause disturbance currents in the lack of homogeneities of the insulation property which is being measured. According to U.S. Pat. No. 2,281,470, apparatus for measuring high electrical resistance comprises a source of D.C., a rectifier for passing current flow from the D.C. source through the resistance to be measured and an instrument for measuring the current from the source to the resistance through the rectifier. The apparatus measures the resistance of a device and can not be used to detect faulty insulators on power transmission lines.

According to U.S. Pat. No. 2,239,598, grounded insulation is tested by applying an A.C. voltage and measuring current or capacitance. According to U.S. Pat. No. 2,923,879, insulators are tested by impressing an alternating voltage across an insulator and measuring the difference between two voltages which represents the resistive component of current through the insulator. According to U.S. Pat. No. 3,363,172 grounded insulators are tested by applying a test voltage and measuring the current flowing through the insulator; the testing means include a transformer and a grounded lead. Most of these disclosures involve grounding the insulator or applying an A.C. voltage.

According to Canadian Pat. No. 1,124,792, insulators can be tested on overhead power transmission lines while the power line remains fully energized. Though this tester utilizes a high voltage capacitor as an energy source in its measuring circuit, a few faulty insulators detection will drain its energy source, thus impairing further readings. Due to this unstable power source, the device will have to be recharged in situ which leads to a time-consuming operation and careful handling due to live probes.

BACKGROUND OF THE INVENTION

It has been found that insulators on distribution power lines can be tested quickly, safely and conveniently while the power line remains fully energized.

The new instrument is portable, compact and may be used in any position. Defective insulators or insulator unit can be detected with convenience and celerity without endangering or disturbing the normal operation of the power line.

According to the invention, the new instrument can detect defective insulators or insulator of the suspension type comprising insulators suspended one above another or arranged in strings of two insulators of the suspension type.

The present invention provides the user with an instrument completely free from auxiliary source of power and capable of detecting faulty suspension type insulators attached in strings of two insulators while the power line remains fully energized.

In fact, both suspension type insulators may be considered as two very high impedances linked in series and connected on one side to the energized power line, the other end of that high value impedance is connected to the pole. The pole should be considered as a moderately low value resistor as there are many metallic objects bolted to the pole and effectively connected to the ground.

In other words, those two high value impedances may be considered as connected on one side to the energized power line and on the other side to the ground via a variable moderately low value resistor.

According to the series circuit law, a very small current will flow through the high value impedances (string of two suspension type insulators) creating a voltage drop at each end of each insulator. This voltage drop will be proportional to the impedance value of each individual insulator.

Generally, the resistance value of the pole will be negligible compared to the very high impedance of the insulator. Based upon that fact, the resistance of the pole can be disregarded.

Using an instrument that takes reading of voltage on one insulator at a time and comparing those readings for two insulators of a two insulators string, will lead to erratic results. Since the impedance of the insulator in good condition is mostly capacitive (few tens of nanofarads), a high resistance high voltage voltmeter based on one insulator of a two unit string will give a voltage reading which is almost at 90° with the voltage drop across the other insulator (the one that is not shunted by a resistor).

As known in the prior art, placing an ammeter 10 in a known power line circuit having two insulator $V_R$ and $V_C$ in series, changes the circit from that of FIG. 1 to that of FIG. 2. One can see that in the case of FIG. 1, the total line voltage $V_L$ is shared equally between each insulator.

In FIG. 2, since $V_C$ for a sound insulator is close to the line voltage $V_R$, a small variation of $V_C$ will cause dramatic changes in $V_R$ across the measuring instrument 10. The mathematical relation between $V_L$, $V_C$ and $V_R$ is approximately represented by the following formula:

$$V_L = \sqrt{V_C^2 + V_R^2}$$

Considering that $V_C$ is close to $V_L$ which is constant, a variation in $V_C$ will cause a greater variation of $V_R$. Variations in $V_C$ may come from variations in capacitance, position on the line, quality or state of the insulator, etc. One other thing has to be taken into account: the fact that certain line structure are very bad conductors.

On a 15 kv $\phi$-ground system, readings from as little as 3000 Volts to over 5000 Volts have been taken on single insulators in a two-unit string in excellent condition depending upon their physical position.

Now, when the insulator starts to degrade, it's impedance will change from mostly capacitive to partly then mainly resistive. Readings will be difficult to interpret since they do not totalize the line to ground voltage and that a large variations may be due to many factors other than the insulator itself. Because such variation is possible on sound units, such an instrument cannot be reliable, easy to use and cannot be interpreted by unspecialized personnel.

Based upon the fact that each insulator will carry at its ends a voltage proportional to its impedance value, the instrument, according to the invention, is capable of taking simultaneous readings of the voltage across each insulator of the string.

The invention relies on the principle that it is highly improbable that two insulators installed in series have suffered exactly the same damage and are still in service. In practice, the aging effect lowers the insulation or impedance value of the insulators over a varying period of time. The insulators share the line voltage in proportion to their insulation or impedance value.

Both insulators of the string are bypassed by equal high voltage resistors. When the circuit configuration is disturbed, the instrument allows direct reading or evaluation of the said disturbance.

Such disturbance can only occur when unequal impedances exist on the string which indicates at least one faulty insulator on said string.

SUMMARY OF THE INVENTION

An apparatus for detecting faulty power line insulators on an energized power line by comparing two adjacently mounted insulators. A fork member has a center prong and two lateral prongs. Each prong has a metal tip forming a probe adapted to straddle two adjacently mounted insulators to be tested. The center prong forms electrically conducting lines with the lateral prongs. A high voltage resistor is mounted in each of the conducting lines. The prongs including the resistors are embedded in and protected by a high dielectric material. A separate ammeter is mounted in each of the two conducting lines for registering the amperage in each line. Comparison is then made of the two registered amperages.

DETAILED DESCRIPTION OF THE DRAWINGS

Figure 1:
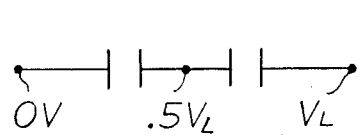
FIGS. 1 and 2 are schematic diagrams of insulators on a power line as described previously.
Figure 2:
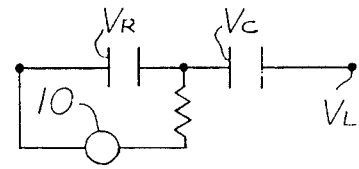
Figure 3:
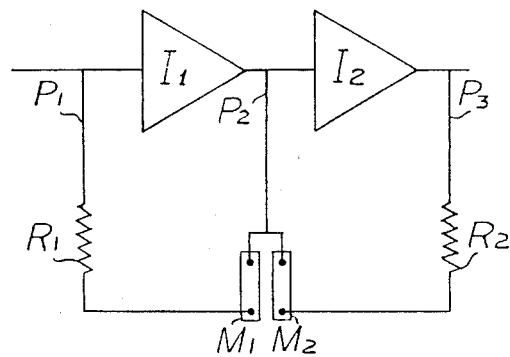
FIGS. 3, 4 and 5 are schematic diagrams of three different embodiments of the detecting apparatus according to the invention.

FIG. 3 diagrammatically illustrates an instrument allowing simultaneous reading of the voltage across each insulator $I_1$ and $I_2$ through a dual milli or microammeter or through two single milli or microammeters $M_1$ and $M_2$.

ELECTRICAL DESCRIPTION

The instrument consists of:

1. Conductive lateral probes $P_1$ and $P_3$ connected to two different meters $M_1$ and $M_2$ or a dual meter through high voltage resistors $R_1$ and $R_2$. Probe $P_2$ is mounted between lateral probes $P_1$ and $P_3$ and the meters $M_1$ and $M_2$ respectively. The resistance values of $R_1$ and $R_2$ must be high enough not to disturb dramatically the high impedance circuit formed by the string of adjacently mounted insulators in series $I_1$ and $I_2$. On the other hand, they should be low enough to keep accurate reading unaffected by the electric field. Values should be in the range of 1 to 100 megohms. The value for a typical 15 kV power line is about 15 megohms with a 15 Watt rating.

Figure 4:
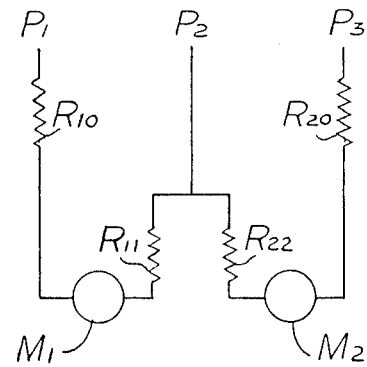

2. The central probe $P_2$ is connected to the other terminal of each meter $M_1$ and $M_2$ or a dual meter. FIG. 3 illustrates a direct connection between the probe $P_2$ and the meters $M_1$ and $M_2$ or a dual meter. An alternative embodiment, shown in FIG. 4, uses two separate high voltage resistors $R_{11}$ and $R_{22}$ between the probe $P_2$ and the meters $M_1$ and $M_2$ provided that the meters $M_1$ and $M_2$ are electrically insulated from one another. All other factors being the same, $R_1 = R_{10} + R_{11}$ and $R_2 = R_{22} + R_{20}$.

3. Meters $M_1$ and $M_2$ or the dual meter are basically milli or microammeters. The scale could be graduated in terms of ampacity or preferably, graduated in kV since the reading corresponds to the voltage stress across each insulator.

Figure 5:
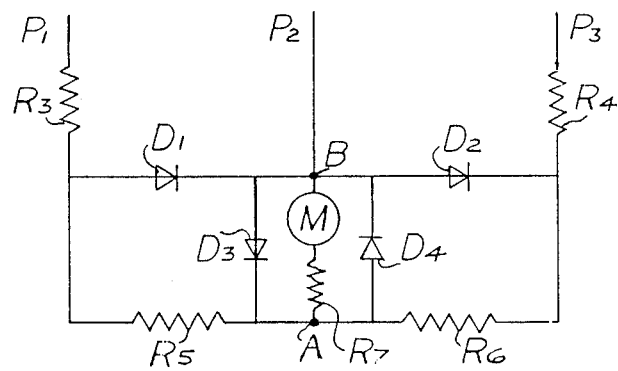

FIG. 5 illustrates an electrical diagram of another embodiment of the detector adapted to indicate only the voltage difference between each insulator. This indication is made possible via an electronic circuitry coupled with a zero center meter M.

ELECTRICAL DESCRIPTION OF FIG. 5

The detector consists of:

Conductive probes P1 and P3 connected to an electronic circuit comprising high voltage resistiors $R_3$ and $R_4$. Their resistance values must be high enough not to disturb dramatically the high impedance circuit formed by the string of insulators. On the other hand, they should be low enough to keep accurate reading unaffected by electric field. Values should be in the range of 1M$\Omega$ to 100M$\Omega$. The value for a typical 15 kV application is 15 megohms with a 15 Watt rating. The central probe $P_2$ is connected at point "B" of the electronic circuit. A suitable zero center microammeter or milliammeter M is fed by the electronic circuitry. The resistors $R_5$ and $R_6$ (10K$\Omega$ to 1 megohms, ¼ to 1 Watt rating) are connected in series to $R_3$ and $R_4$ so that their meeting point "A" is at mid point voltage between $P_1$ and $P_3$ under normal or sound insulator condition. $R_5$ and $R_6$ are low voltage resistirs compared to the high voltage resistors $R_3$ and $R_4$. The diodes $D_1$ and $D_2$ are used to bypass resistors $R_5$ and $R_6$ for half of the cycle. The resistor $R_7$ (100$\Omega$ to 5000$\Omega$, ¼ to 1 Watt) and diodes $D_3$ and $D_4$ (200 to 1000 V PIV (peak inversed voltage), 1 to 10 milliamperes) are used to protect the meter M against overload. $D_3$, $D_4$ and resistor $R_7$ are not essential for the operation of the circuit.

When a significant reading is wanted for a small unbalanced voltage, the above components ($R_7$, $D_3$ and $D_4$) are intended to limit the current to a value acceptable on more sensible meters such as microammeters instead of milliammeters.

Depending upon the characteristics of the meter M, components $R_7$, $D_3$ and $D_4$ may not be necessary. It should be obvious that different electronic circuits may also provide similar or adequate protection.

OPERATING PRINCIPLES

Under normal operation (for sound insulators), the voltage at point "A" lies half way between $P_1$ and $P_3$ due to the resistor arrangement.

Under abnormal operation: faulty insulator condition:

With a faulty insulator in a string of two units, the string will be detected by the apparatus as an unbalanced circuit When paralleling this circuit with the detecting apparatus, a current will circulate through the meter in a direction depending on the location of the faulty insulator.

In the following explanation, no reference is made to the diodes $D_3$ and $D_4$ and resistor $R_7$ considering that their uses are essentially intended as protective means for the micro or milliammeter M.

Figure 6:
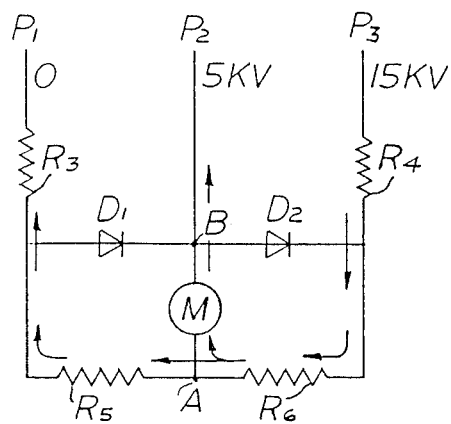
FIGS. 6, 7, 8 and 9 are schematic diagrams of the type shown in FIG. 5, used for explaining the flow of current during the detecting operations.

As an explanation, let us see what happens with a faulty insulator between $P_1$ and $P_2$:

Positive half-cycle: (FIG. 6)

Due to a negative bias, diodes $D_1$ and $D_2$ will not conduct. Since the voltage at point "A" is different than that at point "B", a current will circulate between "A" and "B" through the meter M and then to $P_2$. For values of $R_3$ and $R_4$ equal to 15 megohms and $R_5$ and $R_6$ of negligible value (100K$\Omega$ for example), it can be seen that a current of approximately 330 $\mu$a and 660 $\mu$a will circulate through $R_3$, $R_4$ or $R_5$, $R_6$ respectively which leaves the difference of 330 $\mu$a circulating through the meter M in the direction indicated by the arrows shown in FIG. 6.

Figure 7:
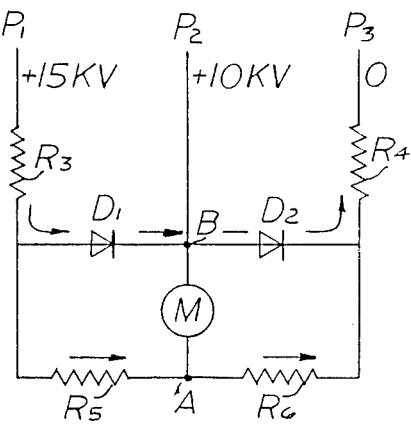

Negative half-cycle: (FIG. 7)

Due to a positive bias, diodes $D_1$ and $D_2$ will conduct, shorting for practical purpose, the bottom end of $R_3$ and $R_4$ with point "B". The current through $R_5$ and $R_6$ will be negligible due to the shorting (or short-circuiting) effect of diodes $D_1$ and $D_2$ so no noticeable current will flow through the meter M.

As another explanation, let us see what happens with a faulty insulator between $P_2$ and $P_3$.

Figure 8:
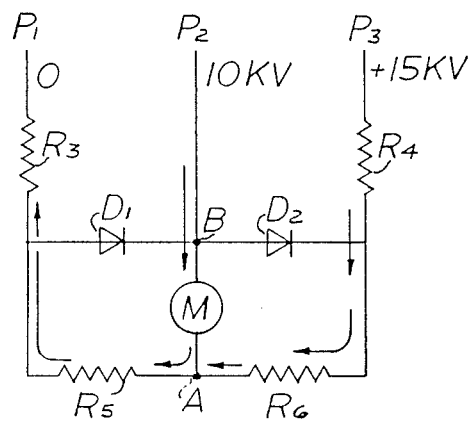

Positive half-cycle: (FIG. 8)

Due to a negative bias, diodes $D_1$ and $D_2$ will not conduct. Since the voltage at point "B" is different than the one at point "A", a current will circulate from $P_2$ to point "B" through the meter M to point "A". For values of $R_3$ and $R_4$ equal to 15 megohms and $R_5$ and $R_6$ of negligible value (100K$\Omega$ for example), it can be realized that a current of approximately 330 $\mu$a and 660 $\mu$a will circulate through $R_4$, $R_3$ or $R_6$, $R_5$ respectively which leaves the difference of 330 $\mu$a circulating through the meter M in the direction indicated by the arrows shown in FIG. 8.

Figure 9:
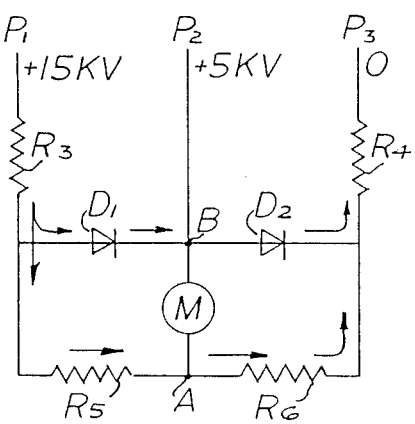

Negative half-cycle: (FIG. 9)

Due to a positive bias, diodes $D_1$ and $D_2$ will conduct, shorting for practical purpose the bottom end of $R_3$ and $R_4$ with point "B". The current through $R_5$ and $R_6$ will be negligible due to the shorting (or short-circuiting) effect of diodes $D_1$ and $D_2$ so no noticeable current will flow through the meter M.

The meter M is connected so that when the current circulates in one direction, the needle moves to the left whereas it moves to the right when the current flows in the other direction. When the diodes $D_3$ and $D_4$ and resistor $R_7$ are used, they are chosen so that the current through the microammeter does not exceed it's capacity. The proper selection of resistor $R_7$ will increase the voltage across $D_3$ or $D_4$ causing them to conduct before the current becomes to excessive for the meter M.

The high voltage resistors $R_1$, $R_2$, $R_3$, $R_4$, $R_{10}$, $R_{11}$, $R_{20}$ and $R_{22}$ are sinked in a high dielectric resin such as urethane so as to be highly resistant to tracking and mechanically protected.

Figure 10:
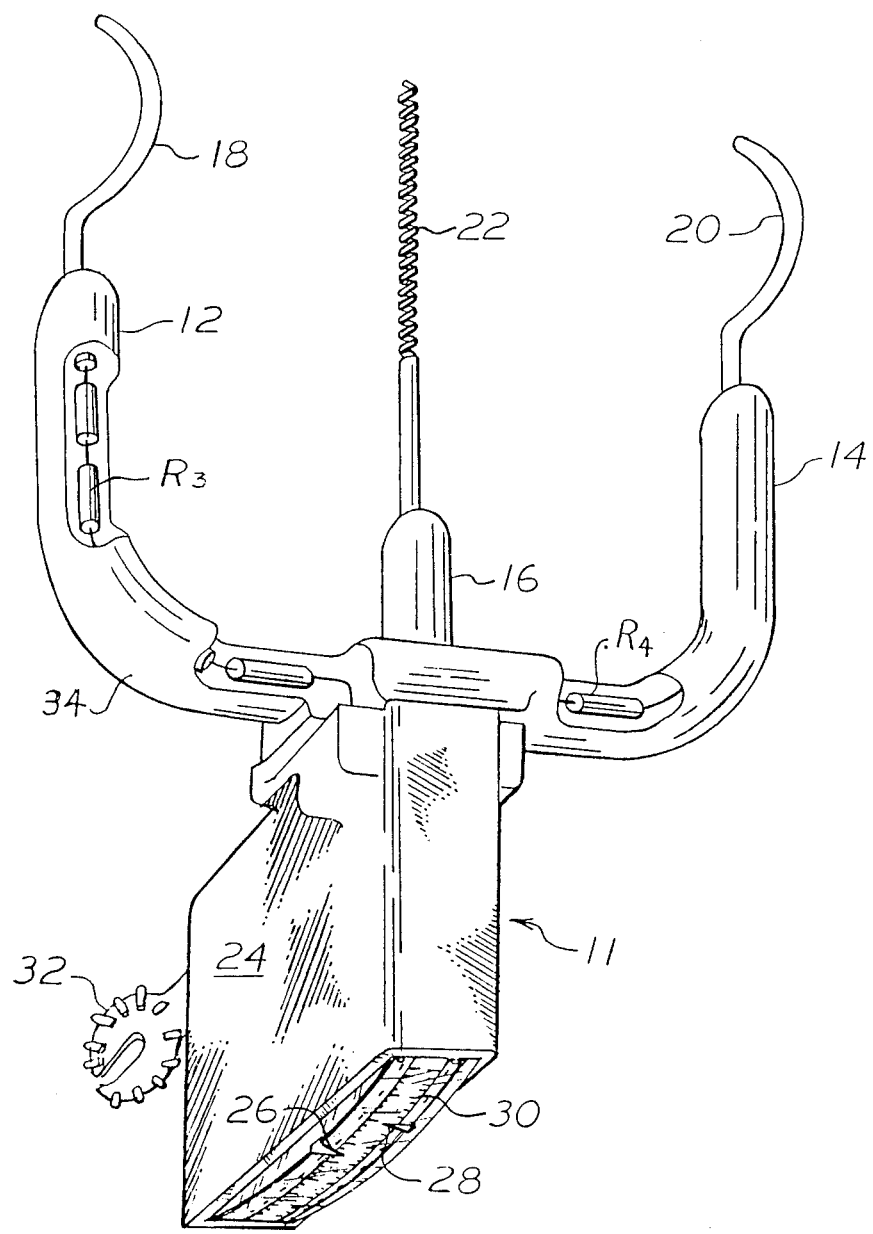
FIG. 10 is a perspective view of an embodiment of a detecting apparatus according to the invention.

FIG. 10 illustrates one concrete embodiment of a detecting apparatus 11 having three prongs 12, 14 and 16 respectively ending with a metal tip 18, 20 and 22 formed by a curved rod. The lateral prongs 12 and 14 each include similar high voltage resistors R and R electrically connected between the metal tips 18 and 20 and a dual ammeter 24. The other terminals of the dual ammeter 24 are connected to the center prong 16 and tip 22. The dual ammeter 24 may be a pair of ammeters-mounted side by side so that their pointer arms 26 and 28 move along a matching scale 30. It is accordingly easy to compare the relative movement of the two pointer arms 26 and 28. A dual meter, model No 1246 produced by International Insutruments of North Branford, Conn. is suitable for use in the present detector. It should be obvious, however that two distinct but similar ammeters may be used to visually compare their readings.

The center tip 22 is made of a coil spring so as to be flexible and positively contact a metallic part or junction between the insulators tested. Such a flexibility is usually needed because the three points of contact between the tips 18, 20 and 22 are not always on the same level.

The apparatus 10 is provided with a known toothed hook fastener 32 which is used to hold the apparatus at the end of an insulated hot line stick.

The resistors $R_3$ and $R_4$, as shown in FIG. 10 may be a series of adjacently connected resistors embedded in a rigid high dielectric material 34 such as urethane.

We claim:

1. An apparatus for comparing a string of two insulators of the suspension type adjacently mounted in series on an energized overhead distribution power line and for detecting an insulation defect of one of said insulators, said apparatus comprising:

a fork member having a central prong and two lateral prongs, each lateral prong forming an electrical conducting line with the central prong, each prong having a metal tip member at their free end, said tips adapted to straddle said adjacently mounted insulators and to contact said power line;

at least two high voltage resistors each having a resistance of about 1 to 100 megohms, each of said resistors being connected in each of said conducting lines, the total impedance value of the resistors being equal in each of said conducting lines;

two ammeters selected from a milliammeter and a microammeter, each of said ammeters mounted in each of said conducting lines for registering the amperage in each line;

means for comparing the values of said amperages.

2. An apparatus as recited in claim 1, wherein each of said resistors are electrically mounted between one of the lateral prongs and one of the ammeters.

3. An apparatus as recited in claim 2, wherein part of each of said resistors are separately mounted between one of the ammeters and the central prong.

4. An apparatus as recited in claim 3, wherein the said ammeters are electrically insulated from each other.

5. An apparatus as recited in claim 1, wherein the tip member of the lateral prongs are rigid curved metal rods adapted to rest in a conducting contact with both ends of the string.

6. An apparatus as recited in claim 5, wherein the tip member of the central prong is a flexible rod adapted to contact a metallic junction between the insulators when the two lateral prongs are electrically contacting both ends of the string.

7. An apparatus as recited in claim 1, wherein each ammeter has a linear scale positioned adjacent to each other, each scale having a needle adapted to be juxtaposed for comparative reading of both amperages.

8. An apparatus as recited in claim 1, wherein the two ammeters are provided with a common reading scale adapted to give a visual display of the differences between the amperage of each ammeter.

9. An apparatus for comparing a string of two insulators of the suspension type adjacently mounted in series on an energized power line and for detecting insulation defect of one of said insulators, said apparatus comprising:

a fork member having a central prong and two lateral prongs, adapted to straddle said adjacent insulators and contact said power line, each lateral prong forming an electrically conducting line with the central prong;

a pair of high and low voltage resistors mounted in each of said conducting lines, the said pairs of resistors being connected to a common point "A";

a first pair of diodes, each diode of said first pair of diodes respectively connected to a point between each of the high and low voltage resistors and to the central prong, the said central prong being connected to a point "B" between said first pair of diodes;

an ammeter mounted between said point "A" and point "B";

whereby the flow of current in the ammeter indicates a defective insulation in one of said insulators.

10. An apparatus as recited in claim 9, comprising a second pair of diodes independently connected between said points "A" and "B" on each side of said ammeter, and a low impedance resistor mounted in series with said ammeter between said points "A" and "B", said second pair of diodes and said low impedance resistor being adapted to protect the ammeter against excessive current.

* * * * *